United States Patent
Ju et al.

(10) Patent No.: US 7,061,037 B2
(45) Date of Patent: Jun. 13, 2006

(54) MAGNETIC RANDOM ACCESS MEMORY WITH MULTIPLE MEMORY LAYERS AND IMPROVED MEMORY CELL SELECTIVITY

(75) Inventors: Kochan Ju, Monte Sereno, CA (US); Heinrich Sussner, Palo Alto, CA (US)

(73) Assignee: Maglabs, Inc., San Jose, CA (US)

( * ) Notice: Subject to any disclaimer, the term of this patent is extended or adjusted under 35 U.S.C. 154(b) by 192 days.

(21) Appl. No.: 10/884,914

(22) Filed: Jul. 6, 2004

(65) Prior Publication Data

US 2006/0006439 A1    Jan. 12, 2006

(51) Int. Cl.
*H01L 31/062* (2006.01)
(52) U.S. Cl. ............... 257/295; 257/421; 257/E27.006; 365/158
(58) Field of Classification Search ................ 275/295, 275/421, E27.006; 365/158
See application file for complete search history.

(56) References Cited

U.S. PATENT DOCUMENTS

| | | | |
|---|---|---|---|
| 5,640,343 A | 6/1997 | Gallagher et al. | |
| 5,703,805 A | 12/1997 | Tehrani et al. | |
| 5,838,608 A | 11/1998 | Zhu et al. | |
| 5,930,164 A | 7/1999 | Zhu | |
| 6,072,718 A | 6/2000 | Abraham et al. | |
| 6,169,689 B1 | 1/2001 | Naji | |
| 6,269,018 B1 | 7/2001 | Monsma et al. | |
| 6,272,041 B1 | 8/2001 | Naji | |
| 6,331,943 B1 | 12/2001 | Naji et al. | |
| 6,385,082 B1 | 5/2002 | Abraham et al. | |
| 6,515,888 B1 | 2/2003 | Johnson et al. | |
| 6,535,416 B1 | 3/2003 | Daughton et al. | |
| 6,559,511 B1 | 5/2003 | Rizzo | |
| 6,590,806 B1 | 7/2003 | Bhattacharyya | |
| 6,594,175 B1 | 7/2003 | Torok et al. | |

(Continued)

FOREIGN PATENT DOCUMENTS

JP   2003-133528 A2   5/2003

OTHER PUBLICATIONS

Reohr et al., "Memories of Tomorrow", IEEE Circuits & Devices Magazine, Sep. 2002, pp. 17-27.

(Continued)

*Primary Examiner*—Tu-Tu Ho

(57) ABSTRACT

A magnetic random access memory (MRAM) has multiple stacked memory layers, with each memory layer being a plurality of alternating rows of memory cells and electrically conductive access lines. The access lines in each layer are aligned with the access lines in the layers above and below. Similarly the memory cell rows in each layer are aligned with the memory cell rows in the layers above and below, with the memory cells in adjacent layers forming memory cell columns that extending perpendicularly from the MRAM substrate. The memory cells are connected to bit and word lines for addressing selected cells. The MRAM includes electrical circuitry connected to the access lines for directing currents through the access lines in the memory layer of the selected cell and in the access lines directly above or below to generate magnetic fields that switch the magnetic state of the selected cell without switching the magnetic state of non-selected cells in the memory layers above and below.

22 Claims, 12 Drawing Sheets

U.S. PATENT DOCUMENTS

| | | | |
|---|---|---|---|
| 6,603,678 B1 | 8/2003 | Nickel et al. | |
| 6,621,730 B1 | 9/2003 | Lage | |
| 6,631,085 B1 | 10/2003 | Kleveland et al. | |
| 6,704,220 B1 | 3/2004 | Leuschner | |
| 6,807,086 B1 * | 10/2004 | Kajiyama | 365/157 |
| 6,903,427 B1 * | 6/2005 | Zhang | 257/391 |
| 2002/0009840 A1 | 1/2002 | Torok et al. | |
| 2002/0036331 A1 | 3/2002 | Nickel et al. | |
| 2002/0163834 A1 | 11/2002 | Scheuerlein et al. | |
| 2003/0090930 A1 | 5/2003 | Rizzo | |
| 2003/0156444 A1 | 8/2003 | Lee et al. | |
| 2003/0161180 A1 | 8/2003 | Bloomquist et al. | |
| 2003/0170976 A1 | 9/2003 | Molla et al. | |
| 2003/0198080 A1 | 10/2003 | Iwata | |
| 2003/0214835 A1 | 11/2003 | Nejad et al. | |

OTHER PUBLICATIONS

Desikan et al., "On-chip MRAM as a High-Bandwidth, Low-Latency Replacement for DRAM Physical Memories", Department of Computer Sciences Tech Report TR-02-47, The University of Texas at Austin, Sep. 27, 2002.

Katti, "Current-in-plane pseudo-spin-valve device performance for giant magnetoresistive random access memory applications (invited)", Journal of Applied Physics, vol. 91, No. 10, May 15, 2002, pp. 7245-7250.

Katine et al., "Current-induced realignment of magnetic domains in nanostructured Cu/Co multilayer pillars", Appl. Phys. Lett., vol. 76, No. 3, Jan. 17, 2000, pp. 354-356.

* cited by examiner

MAGNETIC RANDOM ACCESS MEMORY WITH MULTIPLE MEMORY LAYERS AND IMPROVED MEMORY CELL SELECTIVITY

BACKGROUND OF THE INVENTION

1. Field of the Invention

This invention relates generally to magnetic random access memory (MRAM) and more particularly to MRAM with multiple layers of magnetic memory cells.

2. Description of the Related Art

MRAM with magnetic tunnel junction (MTJ) memory cells has been proposed for nonvolatile memory, as described in U.S. Pat. No. 5,640,343 and by Reohr et al., "Memories of Tomorrow", *IEEE CIRCUITS & DEVICES MAGAZINE*, September 2002, pp. 17–27. In these devices the MTJs are arranged as an array in a single layer (the XY plane) on a semiconductor substrate. In one type of architecture, called a 1T1MTJ MRAM (one transistor and one MTJ), each MTJ is located between a bit line and a transistor, with the word lines located beneath the MTJs. In another type of architecture, called a cross-point (XPC) MRAM, the MTJs are located directly between the bit and word lines. In both MRAM architectures, a selected MTJ cell is "written", i.e. its magnetic state or +/−X magnetization direction is switched, by write currents passing in X and Y directions through the bit and word lines located above and below the selected MTJ. The write currents generate orthogonal magnetic fields in the X and Y directions that switch the magnetization direction of the selected MTJ. One problem in both MRAM architectures is that the write fields can also switch the magnetization directions in other non-selected MTJs near the selected MTJ. Various solutions to this cell selectivity problem have been proposed, including using MTJs with special geometric shapes, as described in U.S. Pat. No. 6,005,800, and using tunable write currents with different current magnitudes, as described in U.S. Pat. No. 6,683,815.

Stacked or multiple-layer MRAM has also been proposed, but is based on either the 1T1MTJ or XPC architecture for single-layer MRAM, and thus requires bit and word lines above and below the memory cells in each of the memory layers. While solutions have been proposed for the cell selectivity problem in single-layer MRAM, no solutions are known to have been proposed for the cell selectivity problem in multiple-layer MRAM, i.e., writing to a selected cell in one memory layer without also writing to non-selected cells in other memory layers in the stack.

What is needed is an MRAM with multiple memory layers in which a selected cell in one memory layer can be reliably written without also writing to non-selected cells in other memory layers.

SUMMARY OF THE INVENTION

The invention is a multiple-memory-layer MRAM wherein each memory layer is a plurality of alternating rows of memory cells and electrically conductive access lines. The access lines in each layer are aligned with the access lines in the layers above and below. Similarly the memory cell rows in each layer are aligned with the memory cell rows in the layers above and below, with the memory cells in adjacent layers forming memory cell columns that extend perpendicularly from the MRAM substrate. The memory cells are connected to bit and word lines for addressing selected cells. The MRAM includes electrical circuitry connected to the access lines for directing current through the access lines to generate magnetic fields that switch the magnetic state of a selected cell. When a cell is selected to have its magnetic state switched, current is directed in one direction through the access lines laterally adjacent the selected cell in the same layer as the cell, and in the opposite direction through the access lines directly above or below. The magnetic fields generated by these currents superpose near the selected cell and counteract near the non-selected cells directly above and below the selected cell, to thereby assure that only the selected cell has its magnetic state switched. Magnetic flux guides may be associated with and incorporated into the access lines and the memory cells to concentrate the magnetic flux and direct it to the active regions of the selected cells.

The memory cells and access lines in each memory layer may be formed of the same set of films, which simplifies the MRAM fabrication process because the films can be deposited sequentially and then patterned to form the individual memory cells and access lines in each memory layer.

For a fuller understanding of the nature and advantages of the present invention, reference should be made to the following detailed description taken together with the accompanying figures.

DETAILED DESCRIPTION OF THE INVENTION

Figure 1:
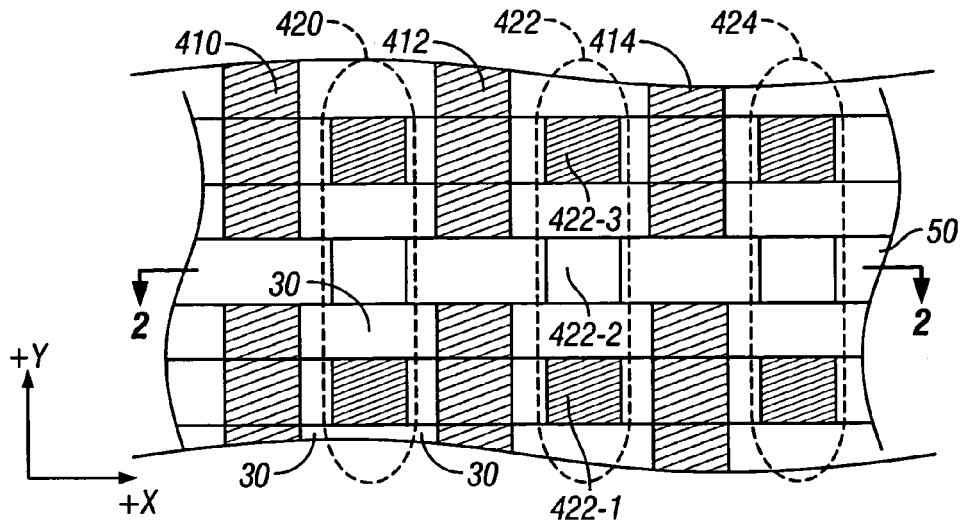
FIG. 1 is a top view of a portion of the MRAM of this invention.
Figure 2:
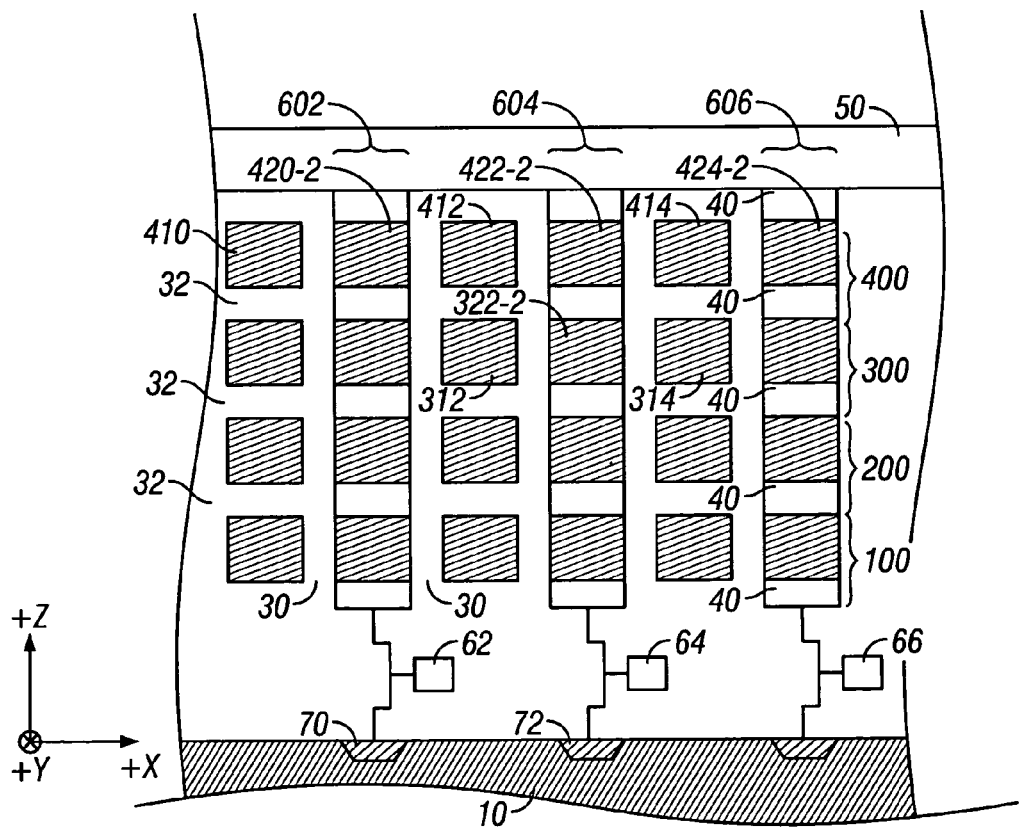
FIG. 2 is a sectional view of section 2—2 of the MRAM portion shown in FIG. 1.
Figure 3:
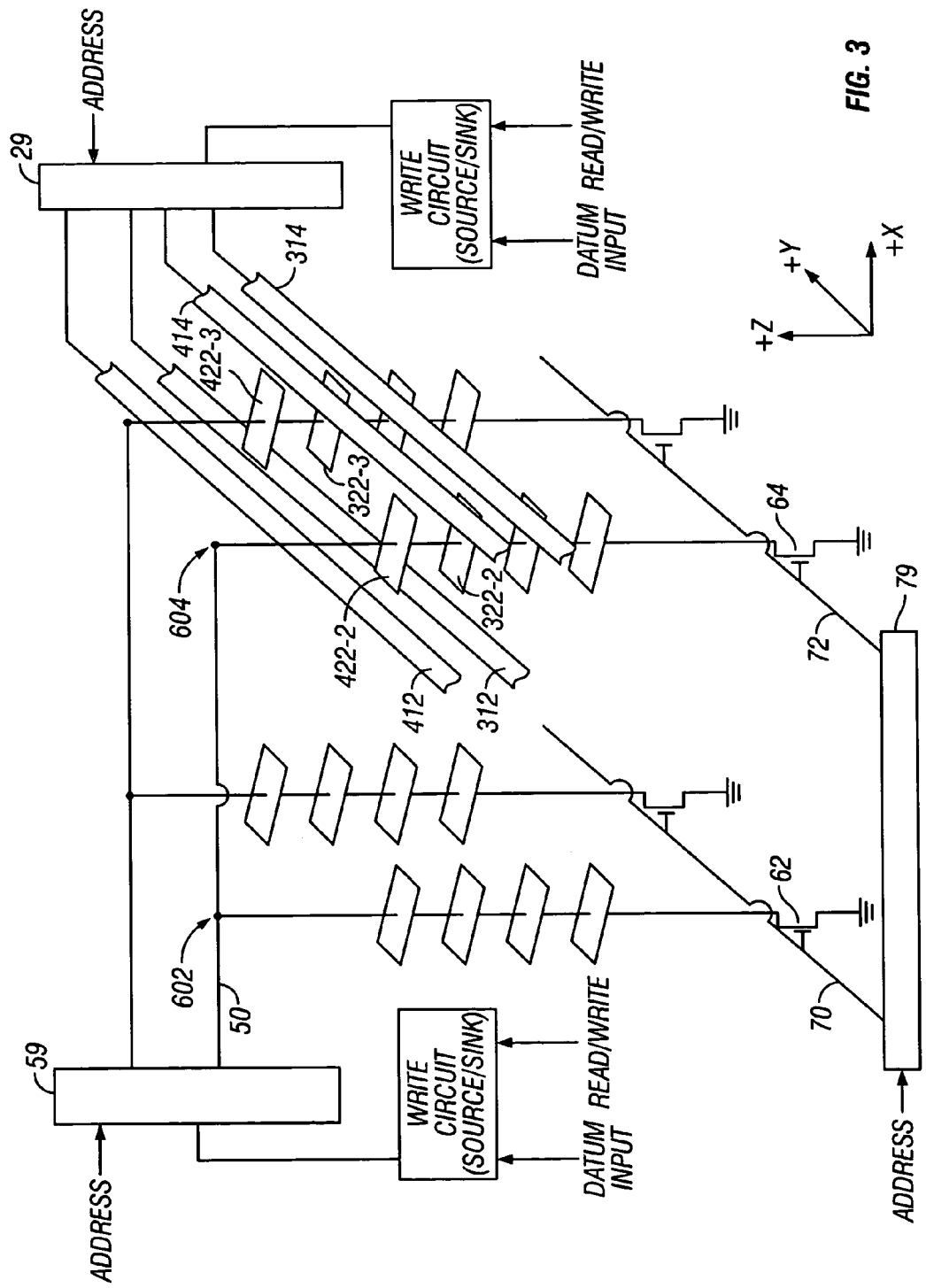
FIG. 3 is a perspective view of a schematic of associated circuitry and bit lines, word lines and access lines for a portion of the MRAM depicted in FIGS. 1 and 2.

The MRAM of this invention is shown in FIGS. 1–3. FIG. 1 is a top view of a portion of the MRAM and FIG. 2 is a sectional view of section 2—2 of FIG. 1. FIG. 3 is a perspective view showing the associated read/write circuitry and the bit lines, word lines and access lines for a portion of the MRAM depicted in FIGS. 1 and 2.

As shown in FIGS. 1 and 2, the MRAM includes a plurality of memory layers stacked on substrate 10, which may be silicon, silicon-on-insulator (SOI), or other known semiconductor-based structures. Four memory layers (100, 200, 300, 400) are shown, but more or less memory layers are possible. Top memory layer 400 is typical and includes a plurality of electrically conductive access lines 410, 412, 414 extending in the +Y direction (into the paper) and a plurality of rows 420, 422, 424 of magnetic memory cells also extending in the +Y direction. The access lines in each memory layer are aligned vertically (Z direction) with the access lines in the other layers in the stack, with the access lines in vertically adjacent layers being separated by electrically insulating material 32. Each row of memory cells has access lines on either side but separated from it by electrically insulating material 30. The electrically insulating material 30 also separates the memory cells in each row from each other, as shown FIG. 1. The material 30, 32 can be any suitable insulating material used in semiconductors, such as alumina ($Al_2O_3$) or $SiO_2$. As shown in FIG. 3, the access lines are connected to an access line connect circuit 29, which is depicted as being connected to typical access lines 312, 314 associated with memory cell row 322 and access lines 412, 414 associated with memory cell row 422.

The top view in FIG. 1 shows only one bit line 50 extending along the X-axis across the memory cell rows of top memory layer 400, with the other bit lines removed to better illustrate the underlying MRAM structure. Each bit line is connected to one memory cell in each row of cells in the top memory layer 400, with the number of bit lines equaling the number of memory cells in a row. As shown in the side sectional view of FIG. 2, the vertically aligned memory cells form columns of memory cells, such as columns 602, 604, 606, that extend perpendicularly from substrate 10. All memory cell columns that are aligned along the X-axis are electrically connected at the top to a common bit line, as shown in FIG. 1 by representative bit line 50 connected to memory cell columns 602, 604, 606. The bit lines are connected to a bit line connect circuit 59, as shown in FIG. 3. The memory cells in each column are electrically connected by conductive material 40.

Electrical switches, which may be metal-oxide-semiconductor field-effect-transistors (MOSFETs) or other known transistors or equivalent switches, are located between the substrate and the memory cell columns, as shown by transistors 62, 64, 66 associated with memory cell columns 602, 604, 606, respectively. The switches are thus aligned in rows beneath the memory cell rows of the lowermost memory layer, as shown in FIG. 3 by the transistors connected to word lines 70, 72. All memory cell columns that are aligned in the Y direction are electrically connected at the bottom to a common word line, as shown in FIG. 3 by representative word lines 70, 72. The word lines are connected to word line connect circuit 79.

Figure 4:
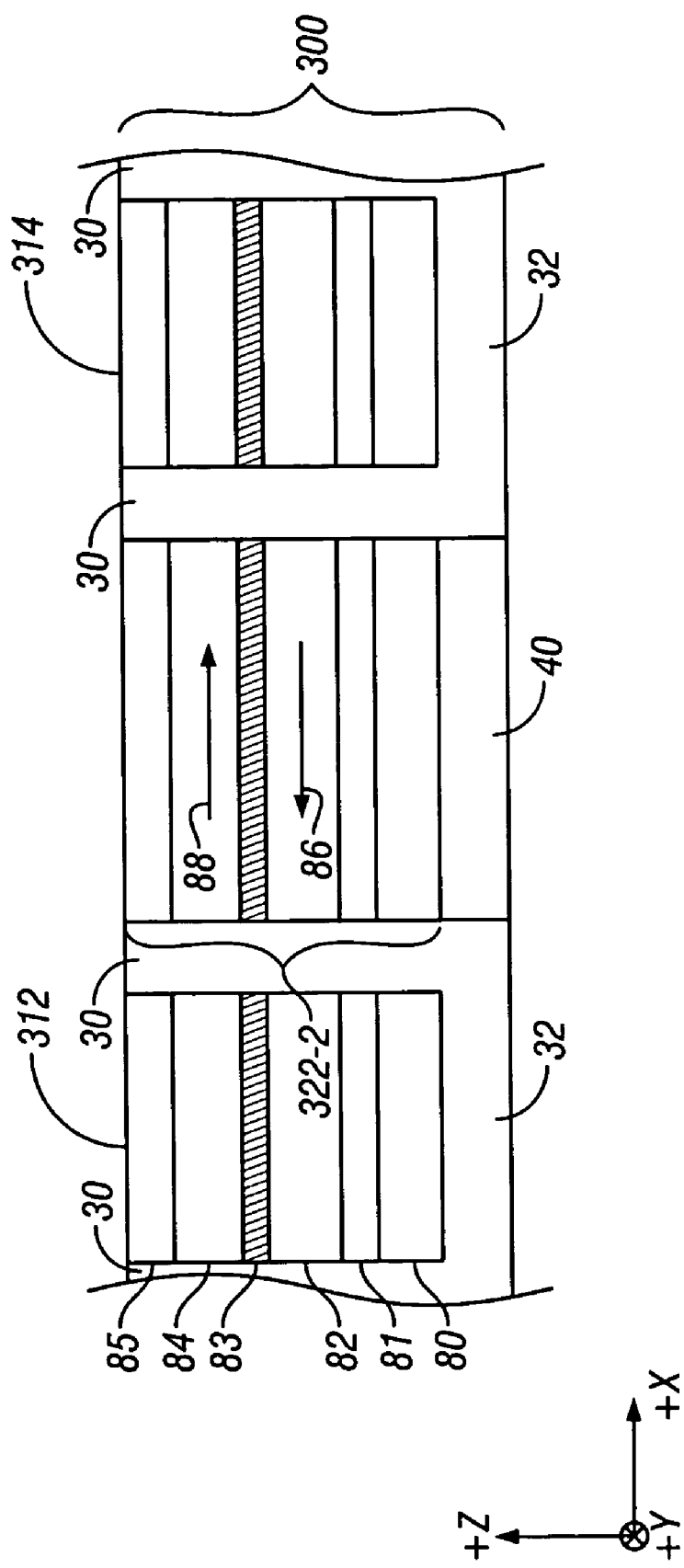
FIG. 4 is a sectional view of a portion of the MRAM illustrating the individual films making up a typical memory cell and its nearest access lines.

FIG. 4 is a sectional view of a portion of the MRAM illustrating the individual films making up a typical memory cell 322-2 and typical access lines 312, 314 in typical memory layer 300. Film 40 is an electrically conductive film, typically Cu or a Cu/Ta bilayer, and provides electrical connection between memory cell 322-2 and the memory cell below it (not shown) in the memory cell column 604 (FIGS. 2 and 3). The memory cell 322-2 depicted in FIG. 4 is a type of MTJ with a free ferromagnetic film and a fixed ferromagnetic film whose magnetization direction is fixed by an antiferromagnetic film, but the invention is fully applicable to other types of MTJs and other types of magnetic memory cells. In all such magnetic memory cells the magnetic state of the cell is read by measuring its electrical resistance, which depends on the in-plane magnetization direction in an active region of the cell.

The materials and thicknesses of films 80–85 are selected to form a MTJ as the memory cell 322-2, but films 80–85 can also function as access lines 312, 314. The use of films 80–85 for both the memory cells and the access lines in the multiple-memory-layer MRAM simplifies the fabrication process for the MRAM because these films can be deposited sequentially and then patterned to form the individual memory cells and access lines in each memory layer. However, the access lines need not be formed of films 80–85, but can be formed of other electrically conductive materials, such as Cu.

The MTJ 322-2 includes a "fixed" ferromagnetic film 82 whose magnetization direction or moment 86 is pinned or prevented from rotation in the presence of an applied magnetic field, a "free" ferromagnetic film 84 whose moment 88 is free to rotate in the presence of an applied magnetic field so as to be either parallel or antiparallel to moment 86, and a thin insulating tunnel barrier 83 between films 86 and 88. Fixed ferromagnetic film 82 has its moment 86 pinned by being exchange-coupled to underlying antiferromagnetic film 81. The free ferromagnetic film 84 is shown as being above tunnel barrier 83, but it can be located below the tunnel barrier with the fixed ferromagnetic film 82 then being located above the tunnel barrier. As is well known, the direction of the moment 88 of free ferromagnetic film 84 determines the magnetic bit state of the MTJ, which is detected by the electrical resistance across the tunnel barrier 83. The MTJ 322-2 is "written" when its magnetization direction 88 is switched from one direction to the opposite direction (+/−X directions).

Antiferromagnetic film 81 is formed on an underlayer or seed layer 80. Seed layer 80 may be formed of NiFeCr, a Ta/NiCr bilayer, or material with a similar electrical resistivity, to also act as a "thermal retainer" film if it is desired to use thermal assistance to switch the magnetic state of the memory cells, as will be described below. A capping film 85, primarily for corrosion protection, is formed on free ferromagnetic film 84. A relatively wide range of materials and thicknesses are known for use in MTJ memory cells, but representative examples for films 80–85 are 2–4 nm Ta or a Ta/NiCr bilayer for seed layer 80; 5–15 nm IrMn, PtMn or FeMn for antiferromagnetic film 81; 2–4 nm CoFe or CoFe/NiFe for fixed ferromagnetic film 82 and free ferromagnetic film 84; 0.5–3.0 nm alumina ($Al_2O_3$) for tunnel barrier 83; and 5–50 nm Ta for capping film 85.

For an MRAM with memory cells having in-plane magnetization, like the MTJ memory cell, the in-plane applied magnetic field required to switch the magnetic state of the cells can be generated by directing write current with the same polarity through the parallel access lines adjacent to the selected cell. In this invention, the applied magnetic write field is generated by conductive lines that are located next to and in substantially the same plane as the memory cells. With this arrangement, multiple memory layers can be easily fabricated because underlying and overlying bit and/or word lines need not be fabricated for each memory layer.

The MTJ 322-2 is selected to be written (i.e., have its magnetization direction 88 switched) when its address (i.e., bit line, word line and memory layer addresses) is received by bit, word and access line connect circuits 59, 79, 29, respectively (FIG. 3). MTJ 322-2 becomes the selected cell because transistor 64 for memory cell column 604 is turned on by word line connect circuit 79, bit line 50 is selected by bit line connect circuit 59, and access line connect circuit 29 has selected access lines 312, 314, all in response to the received address. Current is thus directed along bit line 50 and through column 604 simultaneous with write current through the access lines 312, 314.

Figure 5:
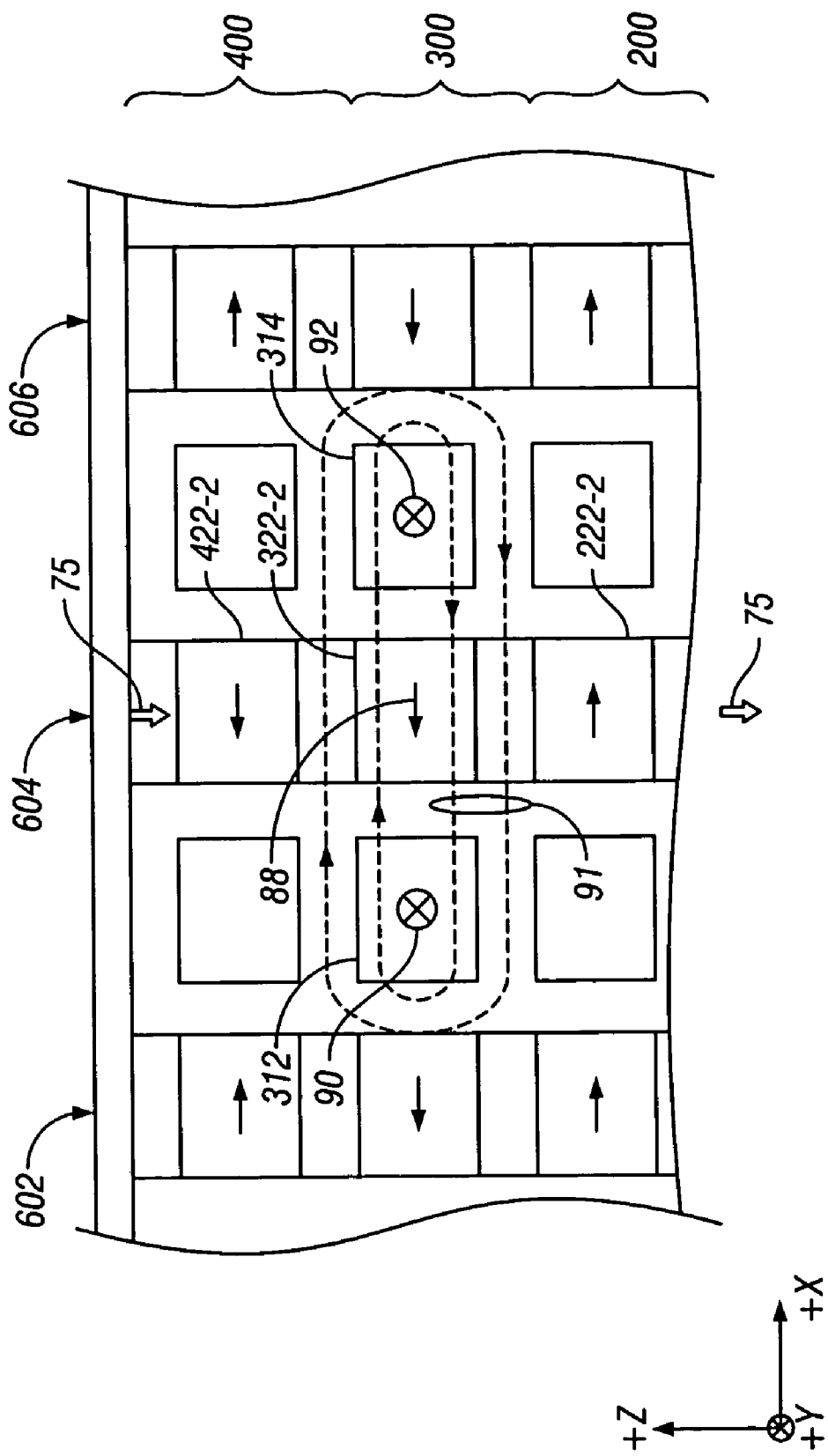
FIG. 5 is a sectional view of a typical MTJ showing the magnetic field generated by write currents directed in one direction through the access lines on each side of the MTJ.

FIG. 5 is a sectional view of MTJ 322-2 and its nearest access lines and neighboring MTJs. Write current 90 is directed in the +Y direction through access line 312 and write current 92 is directed in the +Y direction through access line 314, which generates a magnetic field (shown by the dashed line 91) in the opposite direction to the magnetization direction 88 of MTJ 322-2. With transistor 64 switched on by word line connect circuit 79 (FIG. 3), current 75 is applied through all the memory cells in column 604. This enhances the sensitivity of these cells to have their magnetic state switched by one or more of several effects, e.g., thermal heating and the Oersted field generated by current flow perpendicularly through the MTJ. Thus the applied magnetic field (shown as the dashed lines 91 in FIG. 5) generated by the write currents 90, 92 is sufficient to switch the moment 88 in MTJ 322-2 from the −X direction to the +X direction.

Referring again to FIG. 3, the write circuit connected to access line connect circuit 29 can direct current in either direction through the addressed access lines, in response to the datum input. Similarly the write circuit connected to bit line connect circuit 59 can direct current in either direction through the addressed bit line and the selected memory cell column, in response to the datum input. The direction of the write currents depends on the present magnetic state of the addressed cell, i.e., a 1 or 0, which represents the present direction of magnetization in the addressed cell.

An important feature of an MRAM is the ability to selectively read and write the desired memory cells. In the stacked multiple-memory-layer MRAM according to this invention, where the selected cell is read and written by the application of write current through the parallel access lines nearest the cell in the layer of the cell, it is important that cells in the other memory layers in the stack are not also read or written.

However, with the technique for writing a selected cell as described above with respect to FIG. 5, it is possible that cells in the adjacent memory layers, such as cell 422-2 in memory layer 400, may also be written. This is because the in-plane applied field amplitude peaks at some distance in the vertical or Z direction above the mid-plane of the access lines 312, 314, depending on the geometric configuration of the cells and access lines. Also, while the applied field amplitude in the Z direction is a function on the access-line/memory-cell spacing or periodicity in the memory layer, this variation has been found to be too gradual to allow design of the periodicity as a means to avoid writing non-selected cells. For example, given an equal width W of access-line/memory-cell configuration (where W is on the order of approximately 200 nm), the peak in-plane field occurs about 1 W in the Z direction above and below the access line mid-plane. Also, the field decays to approximately 20% of its peak amplitude at about 10 W distance in the Z direction above and below the access line mid-plane. The difference between the field applied at the selected memory cell and the field present at the neighboring memory cells in the same memory cell column may be too small to allow writing to just the selected memory cell, unless the memory layers are spaced relatively far apart. However, the spacing required to achieve reliable selective writing would severely constrain the vertical packing density of the memory layers.

Figure 6:
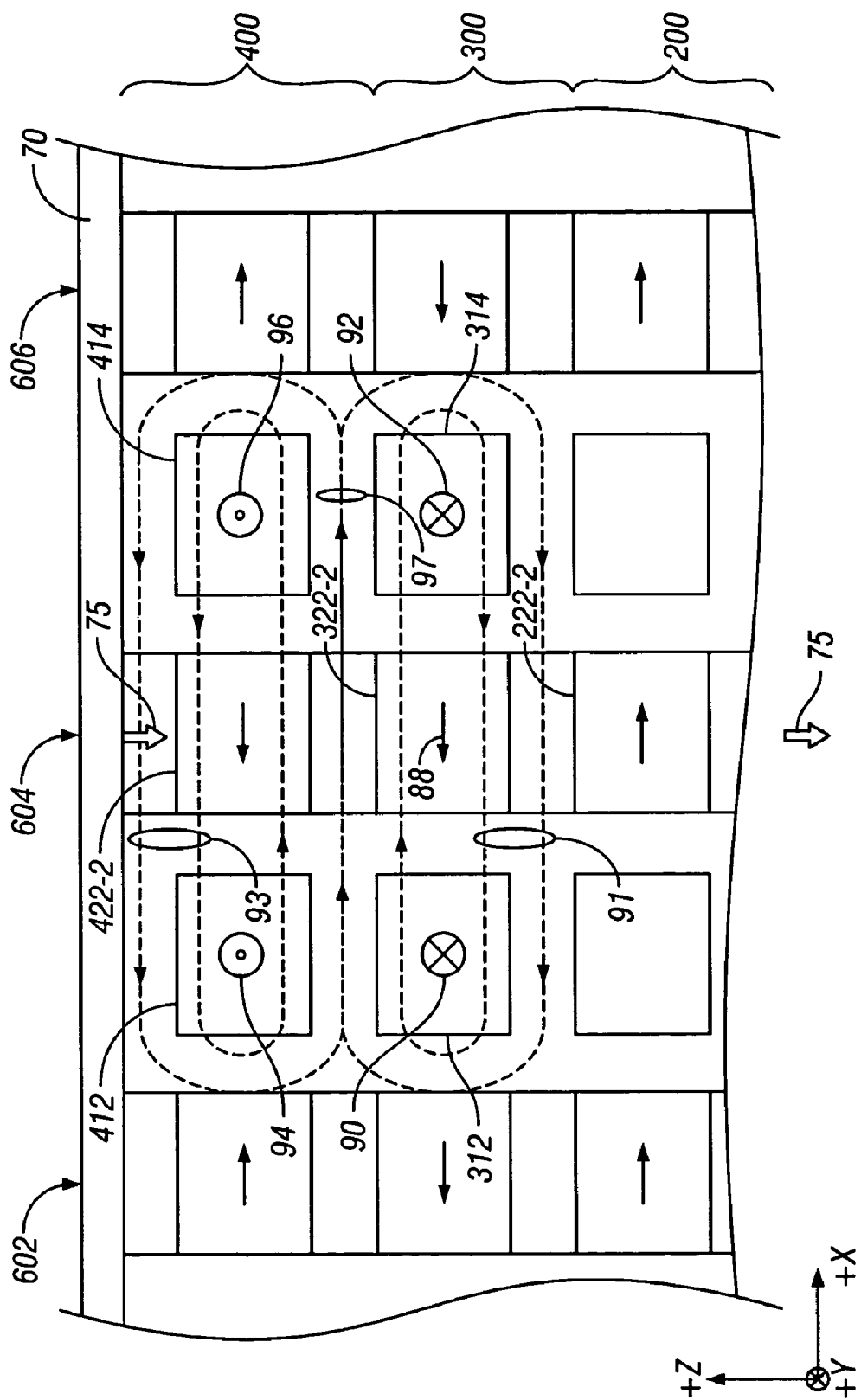
FIG. 6 is a sectional view of a typical MTJ showing the superposition of magnetic fields generated by write currents directed in one direction through the access lines on each side of the MTJ and oppositely-directed write currents through access lines nearest the selected MTJ in an adjacent memory layer.

In this invention, memory cell selectivity is improved by the use of oppositely-directed current through access lines nearest the selected memory cell in an adjacent memory layer to generate a compensating magnetic field. This is shown in FIG. 6, where current 94 is directed through access line 412 in the −Y direction (out of the paper) and current 96 is directed through access line 414 also in the −Y direction. Currents 94, 96 generate a magnetic field (shown by dashed lines 93) in the opposite direction to field lines 91. Thus, the in-plane fields in the region between the two memory layers 300, 400 near the free ferromagnetic film in MTJ 322-2 (with magnetization direction 88) are superposed or enhanced (as shown by field lines 97), while the fields near the free ferromagnetic film in MTJ 422-2 and MTJ 222-2 essentially counteract to reduce the field. This enables magnetization direction 88 in MTJ 322-2 to be switched without switching the magnetization direction in MTJ 422-2. With this technique of writing to a selected cell using currents in one direction through the two access lines nearest the cell in the memory layer of the selected cell and currents in the opposite direction through the two access lines nearest the cell in the adjacent memory layer, a selectivity of greater than five can be achieved. This means that the field on the selected cell is approximately five times greater than the field at the adjacent cell in the same memory cell column. As described above and depicted in FIG. 6, the compensating field is applied by oppositely-directed current through access lines in the memory layer 400 above the memory layer 300 containing the selected cell. However, the compensating filed can also be generated using the access lines in the memory layer 200 below the memory layer 300 containing the selected cell.

The cell selectivity can also be improved in this invention with the use of flux guides. The flux guides are thin films of soft ferromagnetic material with high magnetic permeability located either in contact with or spaced from the conductive access lines. Typical materials include NiFe and NiFeCo alloys. The use of this type of soft ferromagnetic material surrounding and in contact with the word line and bit line conductors in single-layer MRAM structures has been proposed as "cladding" to enhance the field from the conductors because it is known that high permeability reduces magnetic reluctance. Cladded MRAM conductors are described in U.S. Pat. No. 6,683,815. In the present invention, the soft ferromagnetic material may also act like cladding to enhance the field, but is located to guide the peak flux from the access lines to the active regions of the memory cells. Thus the flux guides need not be in contact with the access lines, like cladding layers, but can be spaced from the access lines.

Figure 7A:
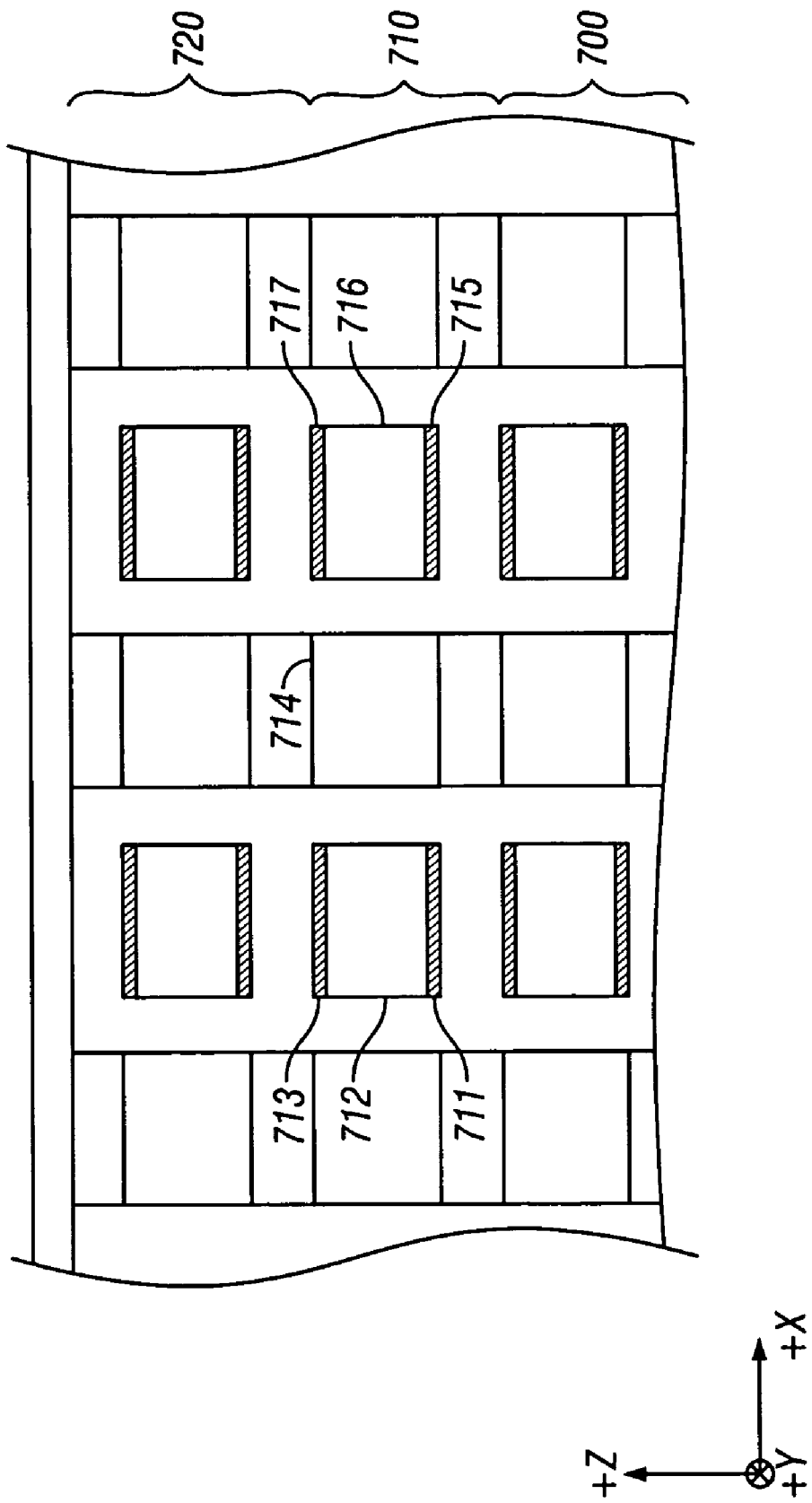
FIG. 7A is a sectional view of a portion of an MRAM according to this invention showing magnetic flux guides associated with the access lines.
Figure 7B:
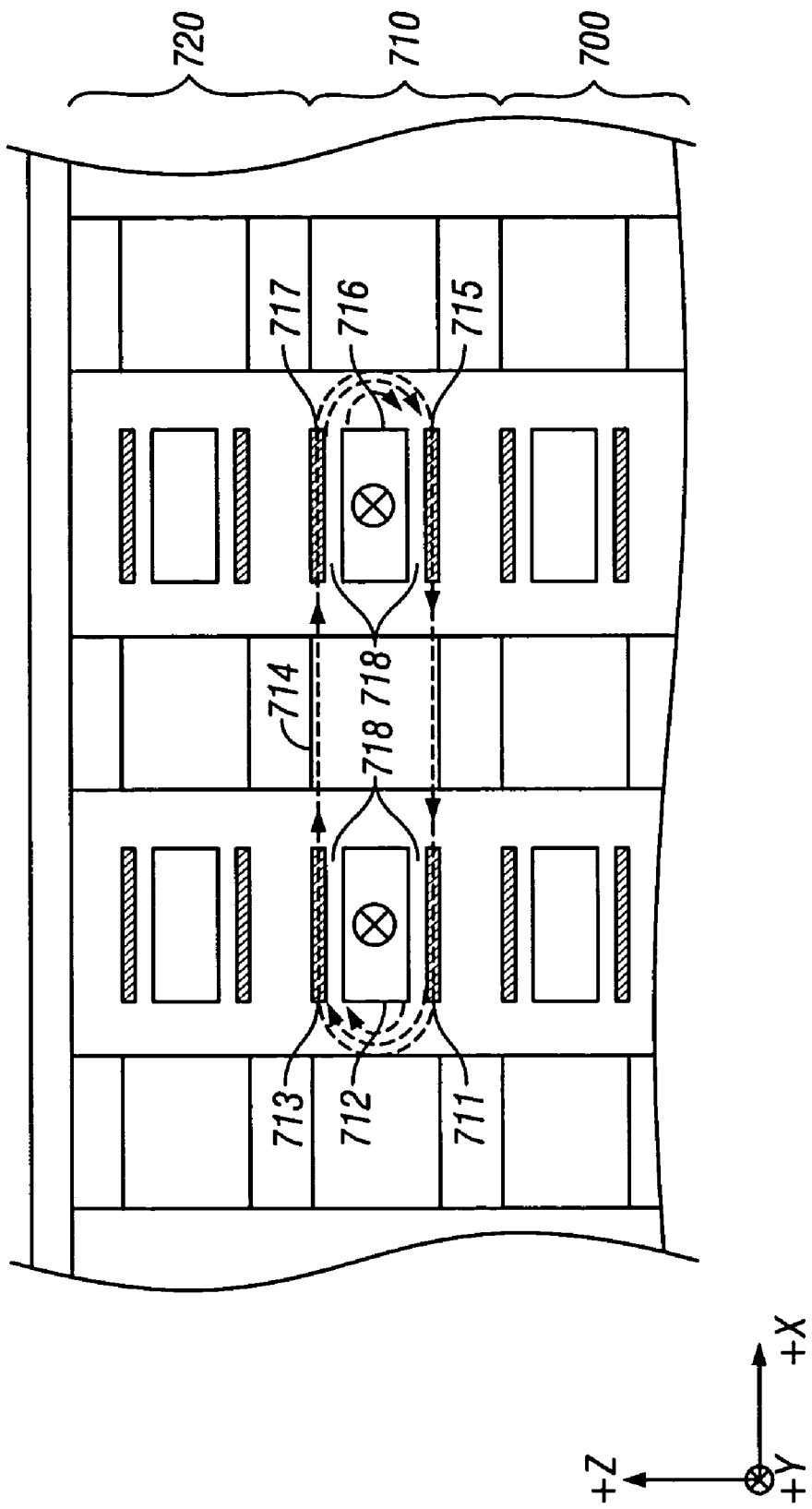
FIG. 7B is a sectional view of a portion of an MRAM according to this invention showing magnetic flux guides associated with but spaced from the access lines.

FIG. 7A is a sectional view of a portion of an MRAM according to this invention with three memory layers 700, 710, 720. Each access line, such as access lines 712, 716 located on either side of cell 714 in layer 710, has a layer of flux guide material formed on its top and bottom. This is shown as flux guides 713, 711 on access line 712 and flux guides 717, 715 on access line 716. FIG. 7B is a sectional view of a portion of an MRAM according to this invention with a variation of the flux guide structure in FIG. 7A. The embodiment shown in FIGS. 7A–7B has two flux guides associated with each access line to better illustrate the concept of guiding the flux to the memory cells. However, in the preferred embodiment only a single flux guide is associated with each access line, as will be described below with respect to FIGS. 8A–8B.

In FIG. 7B the flux guides are spaced from the conductive access lines by insulating material. Flux guides 713, 711 are spaced from access line 712 on the top and bottom, respectively, by insulating material 718. Similarly, flux guides 717, 715 are spaced from access line 716 on the top and bottom, respectively, by insulating material 718. The flux guides 713, 711, 717, 715 concentrate the magnetic flux generated by current flowing in the conductive access lines 712, 716 and direct the flux along the X-axis parallel to the magnetic layers in the memory cell 714, to thereby increase the magnetic field to which the memory cell is exposed, as shown by the arrows in FIG. 7B. The flux guides 713, 717 may be positioned in the Z direction in alignment with the active region of memory cell 714, i.e., the plane of free ferromagnetic film if the memory cell is an MTJ. The insulating material 718 can be the same material used to insulate the access lines from the memory cells.

Figure 8A:
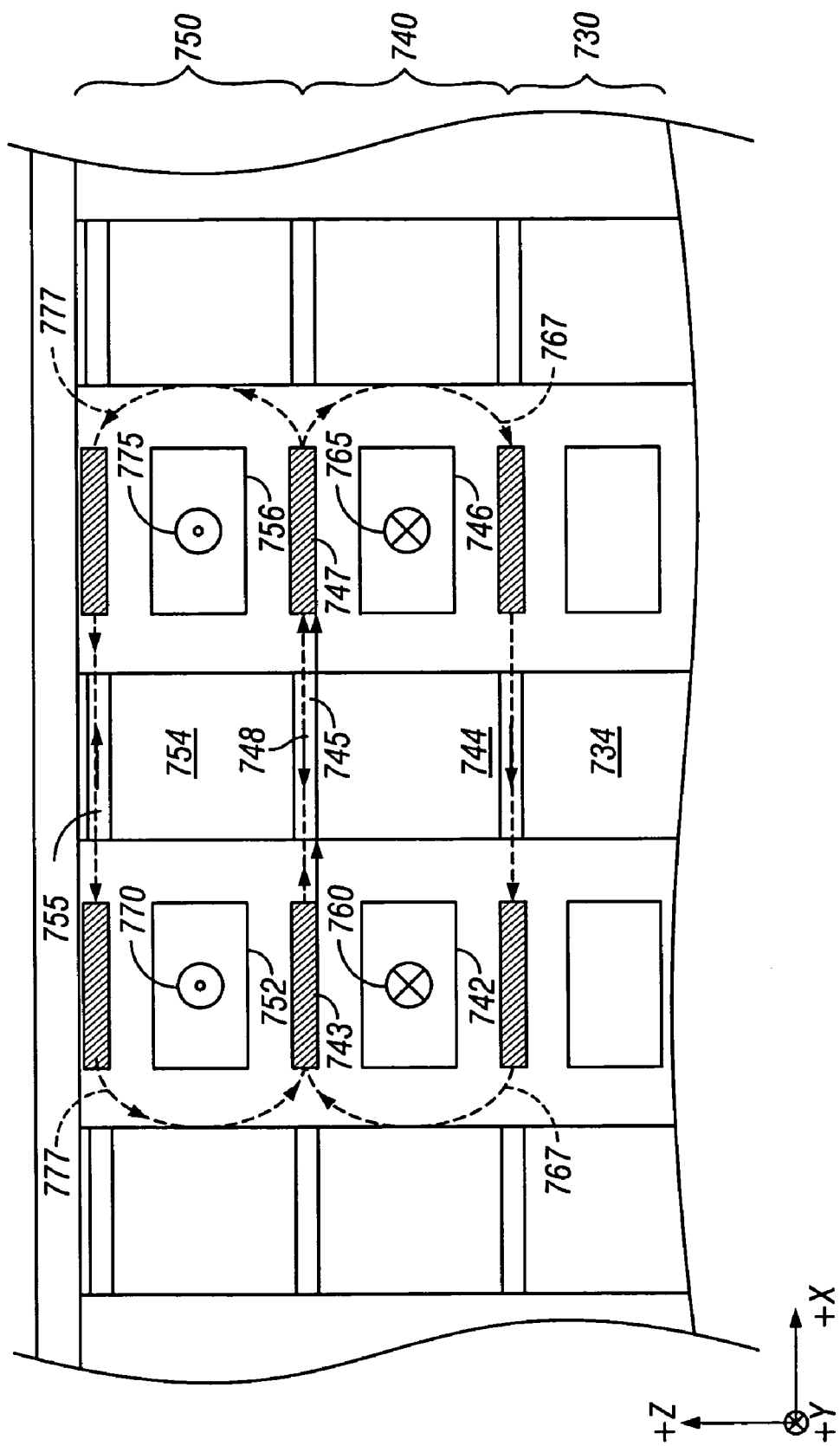
FIG. 8A is a sectional view of a portion of an embodiment of the MRAM illustrating the individual films making up a memory cell and laterally adjacent access lines with a single flux guide aligned in substantially the same plane as the active region of the memory cell.

FIG. 8A illustrates the preferred embodiment of this invention with a single flux guide for each access line, with the flux guides located in substantially the same planes as the active regions of their laterally adjacent memory cells. FIG. 8A is a sectional view of a portion of an MRAM according to this invention with three memory layers 730, 740, 750. Each access line, such as access lines 742, 746 located on either side of cell 744 in layer 740, has a layer of flux guide material formed on its top. This is shown as flux guide 743 on access line 742 and flux guide 747 on access line 746. Flux guides 743, 747 are in substantially the same plane as the active region of memory cell 744. If the memory cell is an MTJ the active region is free ferromagnetic film 745 having a magnetization direction 748.

To switch the magnetization direction 748 in memory cell 744, current 760 is directed through access line 742 in the +Y direction and current 765 is directed through access line 746 also in the +Y direction. Currents 760, 765 generate a magnetic field shown by dashed lines 767 that is opposite to the magnetization direction 748. The flux is concentrated in the access line flux guides 743 and 747 and guided to free ferromagnetic film 745 in memory cell 744. At the same time, current 770 is directed through access line 752 in the −Y direction and current 775 is directed through access line 756 also in the −Y direction. Currents 770, 775 generate a magnetic field shown by dashed lines 777 that is also opposite to the magnetization direction 748 of free ferromagnetic film 745. This flux is also concentrated in the access line flux guides 743 and 747 and guided to the free ferromagnetic film 745. Thus, the in-plane fields in the region between the two memory layers 740, 750 near the free ferromagnetic film 745 in memory cell 744 with magnetization direction 748 are superposed or enhanced. In the region near free ferromagnetic film 755 of non-selected cell 754 the field 777 compensates for the field 767 because the fields 777, 767 are in opposite directions in this region. Thus fields near the free ferromagnetic films in the memory cells 734, 754 in adjacent memory layers 730, 750, respectively, essentially counteract to reduce the field. This enables the magnetization direction 748 in selected memory cell 744 to be switched without switching the magnetization direction in non-selected memory cell 754 above it and non-selected memory cell 734 below it.

Figure 8B:
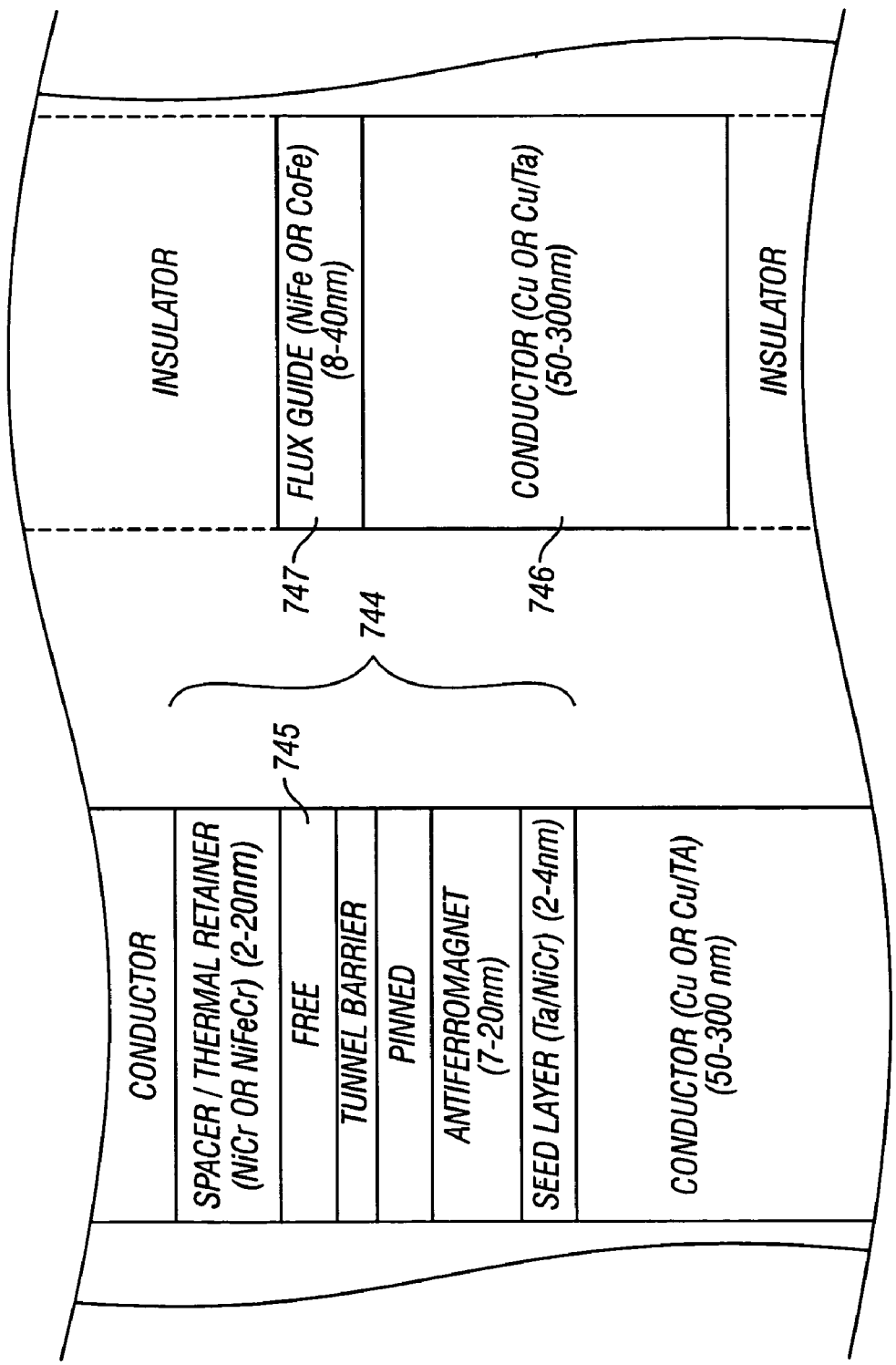
FIG. 8B is a sectional view of the memory cell and a laterally adjacent access line from FIG. 8A illustrating the materials and approximate thicknesses of the films.

FIG. 8B is a view of memory cell 744 and laterally adjacent access line 746 to illustrate the representative materials and approximate thicknesses of the films making up the access lines and memory cells in the embodiment of FIG. 8A. The flux guide 747 is located in substantially the same plane as free ferromagnetic film 745 in the laterally adjacent memory cell 744.

Figure 9:
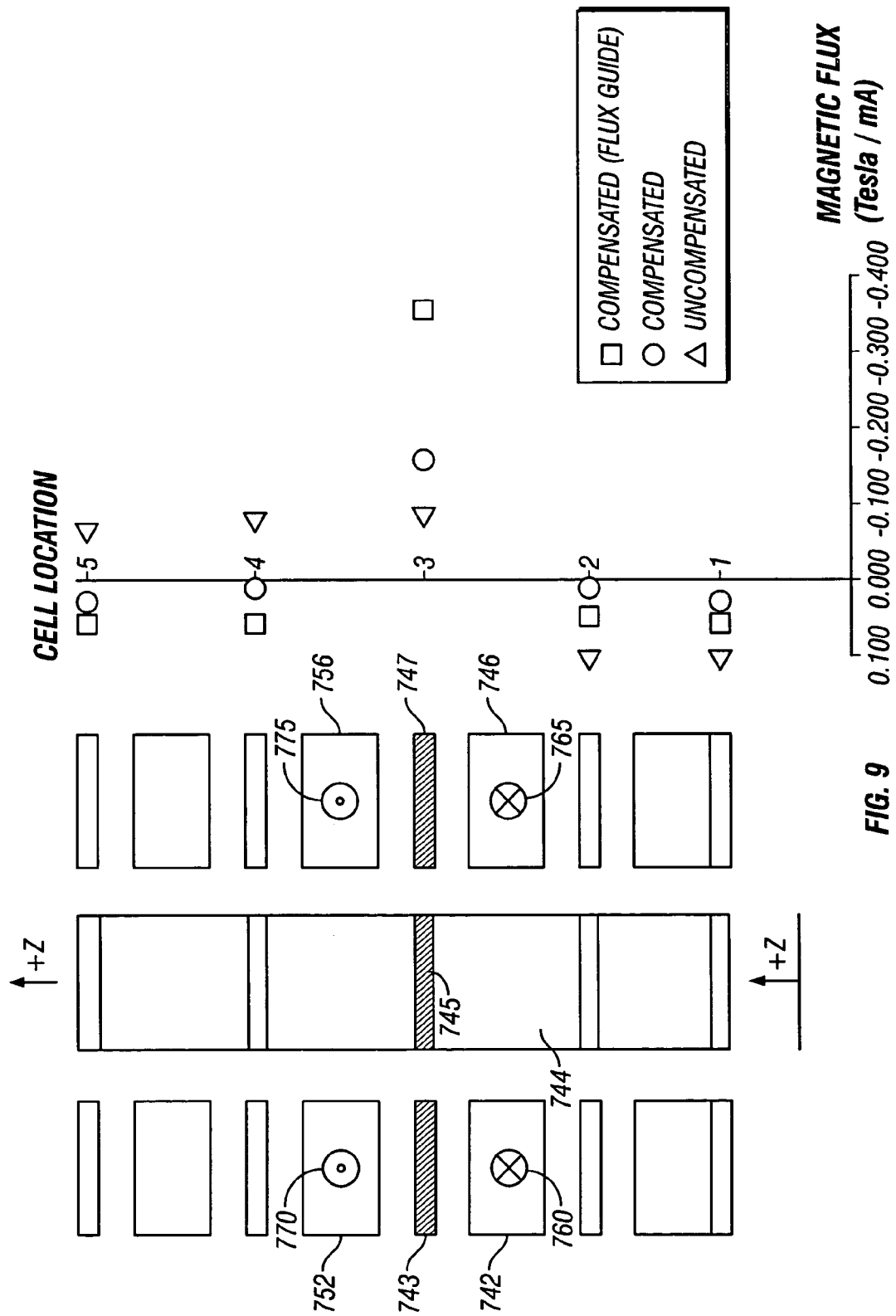
FIG. 9 shows a memory cell column with five free ferromagnetic films next to a plot of magnetic flux in the five films for three different cases; an uncompensated current case, a compensated current case and a compensated current case with flux guides.

FIG. 9 illustrates the improvement provided by this invention. The left side of FIG. 9 shows a portion of a memory cell column and adjacent access lines from the embodiment of FIGS. 8A–8B, with the memory cells and their active regions represented by MTJ memory cells with free ferromagnetic films. Free film 745 in MTJ memory cell 744 is the middle or third free film in the memory cell column that shows five free films. FIG. 9 also shows the two laterally adjacent access lines 742, 746, each with its associated flux guide 743, 747; and the two access lines 752, 756 in the memory layer directly above. The right side of FIG. 9 is the result of a magnetic modeling software program and shows a plot of magnetic flux in the five free films in the memory cell column for three different cases. The triangles represent the flux in the associated free films when there are no flux guides and no compensated current, i.e., currents 760, 765 through only laterally adjacent access lines 742, 746, respectively. The magnitude of the flux through free films #1 through #5 in the +Z direction is very similar, thus indicating a likelihood that the free films in the non-selected cells above and below cell 744 could possibly have their magnetization directions switched. The circles represent the flux in the associated free films when there are no flux guides but with compensated current, i.e., currents 760, 765 through laterally adjacent access lines 742, 746, respectively, as well as oppositely directed currents 770, 775 through access lines 752, 756, respectively, in the memory layer directly above. There is a significant improvement in cell selectivity, as shown by the flux value for free film #3 (film 745 in selected MTJ memory cell 744) being approximately 5 times greater than the flux in any of the other free films. The squares represent the flux in the associated free films when there are flux guides and with compensated current. There is a significant further improvement in cell selectivity over the compensated case, as shown by the flux value for free film #3 (film 745 in selected MTJ memory cell 744) being approximately 6 times greater than the flux in any of the other free films.

Figure 10A:
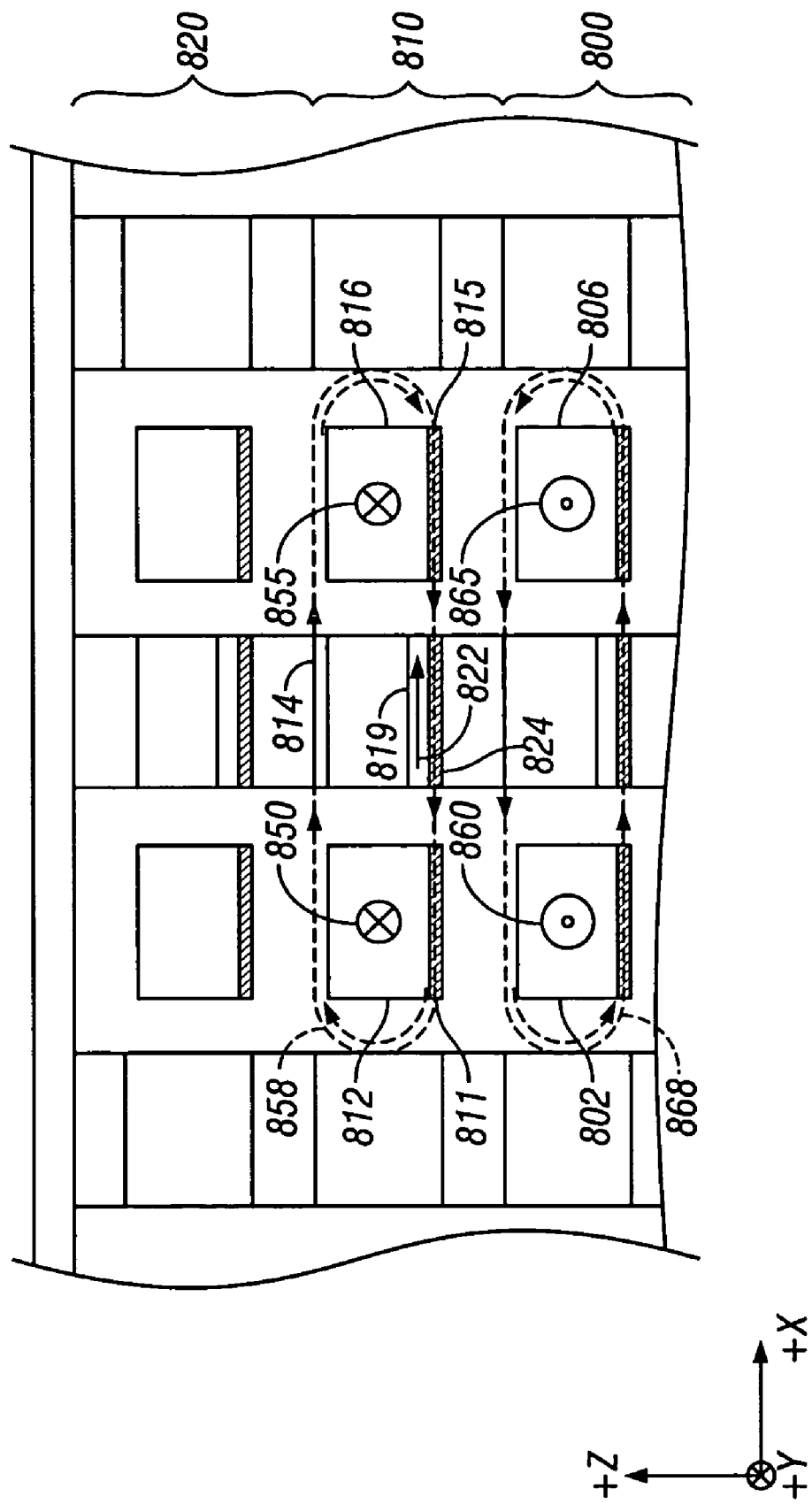
FIG. 10A is a sectional view of a portion of an embodiment of the MRAM illustrating the individual films making up a memory cell and laterally adjacent access lines with a single flux guide for each access line and a flux guide for each memory cell.

In addition to the use of flux guides associated with the access lines, a flux guide may also be used with each memory cell. This embodiment is shown in FIG. 10A, which is a sectional view of a portion of an MRAM according to this invention with three memory layers 800, 810, 820. Each access line, such as access lines 812, 816 located on either side of cell 814 in layer 810, has a layer of flux guide material formed on just its bottom. This is shown as flux guide 811 on access line 812 and flux guide 815 on access line 816. Each memory cell, such as memory cell 814, also has a layer of flux guide material formed on just its bottom, as shown by flux guide 824, which is located beneath the free ferromagnetic film 819 having a magnetization direction 822.

To switch the magnetization direction 822 in memory cell 814, current 850 is directed through access line 812 in the +Y direction and current 855 is directed through access line 816 also in the +Y direction. Currents 850, 855 generate a magnetic field shown by dashed lines 858 that is opposite to the magnetization direction 822. The flux is concentrated in the access line flux guides 811 and 815 and in the memory cell flux guide 824. At the same time current 860 is directed through access line 822 in the −Y direction and current 865 is directed through access line 806 also in the −Y direction. Currents 860, 865 generate a magnetic field shown by dashed lines 868 that is also opposite to the magnetization direction 822 in the region near free ferromagnetic film 819. Some of this flux is also concentrated in the access line flux guides 811 and 815 and in the memory cell flux guide 824. Thus, the in-plane fields in the region between the two memory layers 800, 810 near the free ferromagnetic film 819 in memory cell 814 with magnetization direction 822, are superposed or enhanced, while the fields near the free ferromagnetic films in the memory cells in adjacent layers 800, 820 essentially counteract to reduce the field. This enables the magnetization direction 822 in memory cell 814 to be switched without switching the magnetization direction in the memory cells above and below it.

In the embodiment of FIG. 10A the switching of the magnetization direction 822 in the free ferromagnetic film 819 may be accomplished by magneto-static coupling from the nearby flux guide 824, rather than by the mechanism described above. By proper design of the material and composition of the flux guide 824 and its spacing in the Z direction relative to free ferromagnetic film 819, as well as its spacing in the X direction from the adjacent flux guides 811, 825, the flux guide 824 can generate a relatively strong local magnetic field that dominates over the weaker fields laterally adjacent to the free ferromagnetic film 819. As a result, this strong local magnetic field couples with the free ferromagnetic film 819 at the edges of flux guide 824 and the edges of free ferromagnetic film 819. In this technique, because switching of the magnetization direction 822 occurs as a result of local magneto-static coupling from the flux guide 824, the currents in the access lines 812, 816 and 802, 806 would all be switched from that shown in FIG. 10A to switch the magnetization direction 822 to the opposite direction.

Figure 10B:
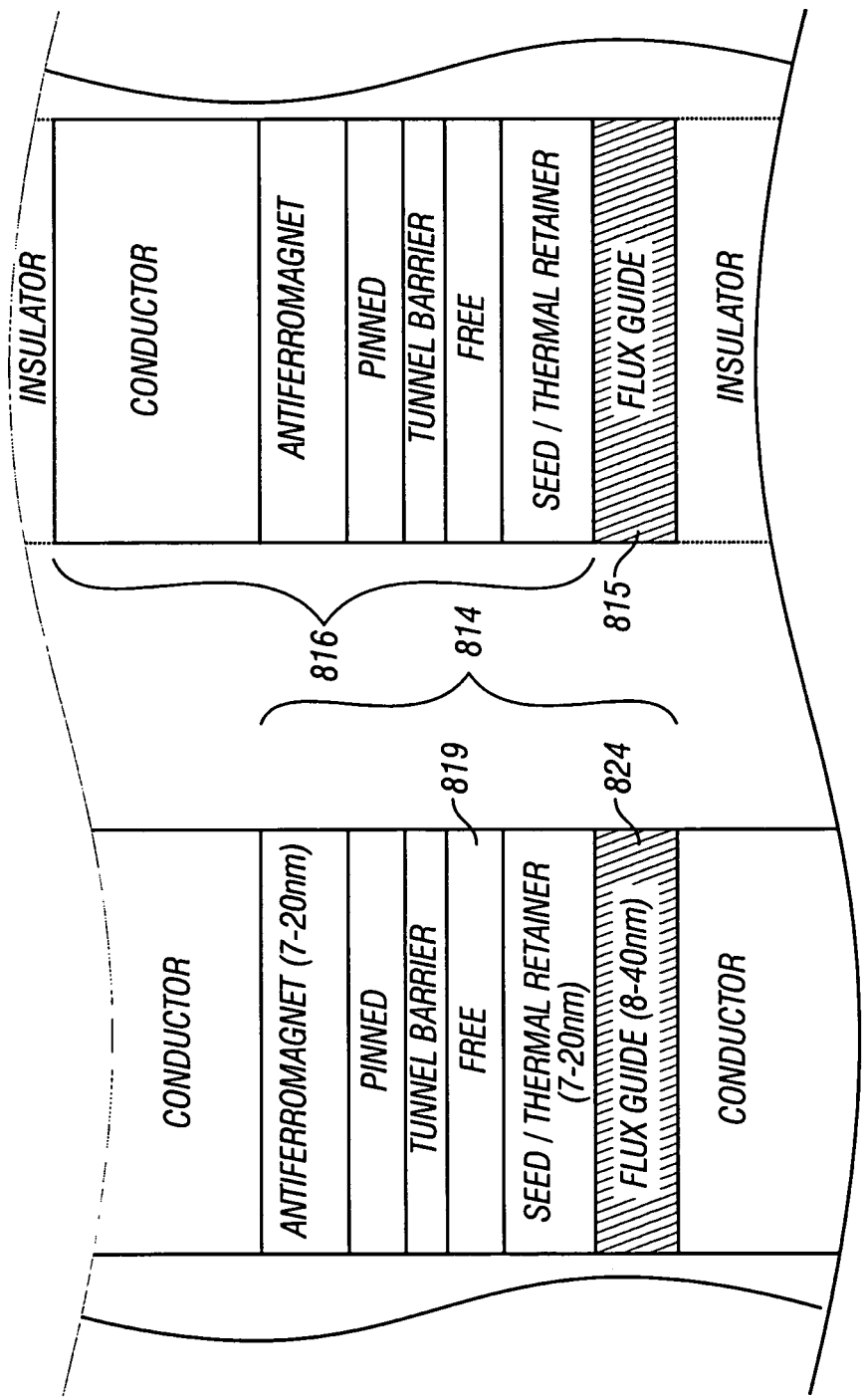
FIG. 10B is a sectional view of the memory cell and a laterally adjacent access line from FIG. 10A illustrating the materials and approximate thicknesses of the films.

FIG. 10B is a view of memory cell 814 and laterally adjacent access line 816 to illustrate the materials and approximate thicknesses of the films making up the access lines and memory cells in the embodiment of FIG. 10A. The material composition and thicknesses of the films are the same for memory cell 814 and access line 816 beginning with the flux guides 824, 815, respectively, up through the top conductor above access line 816. As described previously, the use of the same films for both the memory cells and the access lines in the MRAM simplifies the fabrication process for the multiple-memory-layer MRAM because these films can be deposited sequentially and then patterned to form the individual memory cells and access lines in each memory layer.

While the invention has been described above with respect to improving cell selectivity during a write operation, the invention is also applicable during a read operation. Referring again to FIG. 3, an addressed cell is read, i.e., its magnetic state determined, by the application of read current from the write source connected to bit line connect circuit 59. Read current is directed through the appropriate memory cell column on the addressed bit line by the address sent to word line connect circuit 79 which turns on the transistor in the memory cell column of the addressed cell. In one method for reading, read current is sent to the access lines associated with the addressed cell to switch the magnetization of the cell twice, once from its present state to the other state and then back to its original state. The magnetic state is read by measuring the resistance across the memory cell column after the first magnetization switch and again after the magnetization switch back to the original state, and determining the difference in the two measured resistances. The invention described above for selecting just the addressed cell for writing can also be used for reading just the addressed cell, which prevents writing to non-selected cells during the read operation. The read current applied to the access lines is generally less than the write current applied to the access lines.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A magnetic random access memory (MRAM) comprising:
  a substrate;
  a plurality of memory layers stacked on the substrate, each memory layer comprising a plurality of rows of memory cells and a plurality of electrically conductive access lines, each memory cell row being located between two access lines, the access lines in each layer being generally aligned with the access lines in adjacent layers and the memory cells in each layer being generally aligned with the memory cells in adjacent layers to form a plurality of memory cell columns extending generally perpendicularly from the substrate; and
  access line circuitry for directing electrical current in one direction through the access lines nearest a selected memory cell in the layer of said selected cell and in the opposite direction through the access lines nearest said selected cell in a layer adjacent the layer of said selected cell.

2. The MRAM of claim 1 further comprising:
  a plurality of electrically conductive bit lines, each bit line extending across the rows of memory cells in the uppermost memory layer in the stack and being connected to a single memory cell in each row in the uppermost memory layer;
  a plurality of switches on the substrate, each switch being electrically connected to a memory cell column, whereby the switches are arranged in rows below the memory cell rows in the lowermost memory layer of the stack; and
  a plurality of electrically conductive word lines, each word line connecting the switches in a row of switches.

3. The MRAM of claim 2 further comprising bit line circuitry for directing electrical current to the bit line connected to the memory cell column containing said selected cell, and word line circuitry for turning on the switches in the row of switches connected to the memory cell column containing said selected cell, whereby current flows through said selected cell simultaneous with current through the access lines nearest said selected cell in said selected cell's memory layer and adjacent memory layer.

4. The MRAM of claim 1 further comprising electrically conducting material located between the memory cells in each of the memory cell columns.

5. The MRAM of claim 1 wherein the memory cells and access lines in each memory layer are formed of a plurality of substantially the same films and wherein the rows of memory cells and the access lines in each memory layer are separated by electrically insulating material.

6. The MRAM of claim 1 further comprising a magnetic flux guide associated with each access line for concentrating the magnetic flux generated by current through the access line.

7. The MRAM of claim 6 wherein the flux guide is in contact with the access line.

8. The MRAM of claim 6 wherein the flux guide is spaced from the access line by electrically insulating material.

9. The MRAM of claim 6 further comprising a magnetic flux guide associated with each memory cell.

10. The MRAM of claim 1 wherein the memory cells are magnetic tunnel junctions (MTJs), each MTJ having a free ferromagnetic film with an in-plane magnetization substantially free to rotate in the presence of an applied magnetic field.

11. The MRAM of claim 10 further comprising a magnetic flux guide associated with each access line for concentrating the magnetic flux generated by current through the access line.

12. The MRAM of claim 11 wherein each flux guide is aligned in substantially the same plane as the free ferromagnetic films of its associated MTJ.

13. The MRAM of claim 11 further comprising a magnetic flux guide associated with each MTJ for concentrating the magnetic flux near the free ferromagnetic film of its associated MTJ.

14. A magnetic random access memory (MRAM) comprising:
 a substrate;
 a plurality of memory layers stacked on the substrate, each memory layer comprising a plurality of alternating rows of magnetic tunnel junction (MTJ) memory cells and electrically conductive access lines, and insulating material separating the rows of memory cells and access lines, the access lines in each layer being generally aligned with the access lines in adjacent layers and the memory cells in each layer being generally aligned with the memory cells in adjacent layers to form a plurality of memory cell columns extending generally perpendicularly from the substrate;
 a plurality of electrically conductive bit lines, each bit line extending across the rows of memory cells in the uppermost memory layer in the stack and being connected to a single memory cell in each row in the uppermost memory layer;
 a plurality of switches on the substrate, each switch being electrically connected to a memory cell column, whereby the switches are arranged in rows below the memory cell rows in the lowermost memory layer of the stack;
 access line circuitry responsive to a memory cell address identifying a selected cell for directing electrical current in one direction through the access lines nearest said selected cell in the layer of said selected cell and in the opposite direction through the access lines nearest said selected cell in a layer adjacent the layer of said selected cell;
 bit line circuitry responsive to said selected cell address for directing electrical current to the bit line connected to the memory cell column containing said selected cell; and
 word line circuitry responsive to said selected cell address for turning on the switches in the row of switches connected to the memory cell column containing said selected cell;
 whereby current flows through said selected cell simultaneous with current through the access lines, the current through the access lines generating superposing magnetic fields at said selected cell.

15. The MRAM of claim 14 further comprising electrically conducting material located between the memory cells in each of the memory cell columns.

16. The MRAM of claim 14 wherein the MTJ memory cells and access lines in each memory layer are formed of a plurality of substantially the same films.

17. The MRAM of claim 14 further comprising a magnetic flux guide associated with each access line for concentrating the magnetic flux generated by current through the access line.

18. The MRAM of claim 17 wherein the flux guide is in contact with the access line.

19. The MRAM of claim 17 wherein the flux guide is spaced from the access line by electrically insulating material.

20. The MRAM of claim 17 further comprising a magnetic flux guide associated with each MTJ memory cell.

21. The MRAM of claim 17 wherein each MTJ memory cell has a free ferromagnetic film with an in-plane magnetization substantially free to rotate in the presence of an applied magnetic field and wherein the flux guide associated with each access line concentrates the magnetic flux substantially in the plane of the free ferromagnetic film.

22. The MRAM of claim 21 wherein each flux guide is aligned in substantially the same plane as the free ferromagnetic films of its associated MTJ memory cell.

* * * * *